US012794198B2

(12) United States Patent
Weng et al.

(10) Patent No.: US 12,794,198 B2
(45) Date of Patent: Nov. 10, 2026

(54) VERTICAL-CAVITY SURFACE-EMITTING LASER

(71) Applicant: VERTILITE CO., LTD., Jiangsu (CN)

(72) Inventors: Weicheng Weng, Jiangsu (CN); Cheng Zhang, Jiangsu (CN); Song Liu, Jiangsu (CN); Dong Liang, Jiangsu (CN)

(73) Assignee: VERTILITE CO., LTD., Jiangsu (CN)

( * ) Notice: Subject to any disclaimer, the term of this patent is extended or adjusted under 35 U.S.C. 154(b) by 562 days.

(21) Appl. No.: 18/281,786

(22) PCT Filed: Aug. 10, 2021

(86) PCT No.: PCT/CN2021/111723

§ 371 (c)(1),
(2) Date: Sep. 13, 2023

(87) PCT Pub. No.: WO2023/279469

PCT Pub. Date: Jan. 12, 2023

(65) Prior Publication Data

US 2024/0162687 A1 May 16, 2024

(30) Foreign Application Priority Data

Jul. 9, 2021 (CN) ......................... 202110777105.8

(51) Int. Cl.

*H01S 5/42* (2006.01)
*H01S 5/042* (2006.01)
*H01S 5/183* (2006.01)

(52) U.S. Cl.

CPC ............ *H01S 5/423* (2013.01); *H01S 5/0421* (2013.01); *H01S 5/04257* (2019.08); *H01S 5/18313* (2013.01)

(58) Field of Classification Search

CPC ........... H01S 5/42–426; H01S 5/04257; H01S 5/18–187; H01S 5/40–426

See application file for complete search history.

(56) References Cited

U.S. PATENT DOCUMENTS

| | | | |
|---|---|---|---|
| 4,732,469 | A | 3/1988 | Souma |
| 5,554,949 | A | 9/1996 | Suwald |

(Continued)

FOREIGN PATENT DOCUMENTS

| | | | |
|---|---|---|---|
| CN | 1622410 | A | 6/2005 |
| CN | 101501946 | A | 8/2009 |

(Continued)

OTHER PUBLICATIONS

Extended European Search Report issued in International Application No. 21948959.8, dated Feb. 17, 2025.

(Continued)

*Primary Examiner* — Joshua King

(74) *Attorney, Agent, or Firm* — Carter, DeLuca & Farrell LLP; George Likourezos

(57) ABSTRACT

Provided VCSEL including substrate, emitters arranged in m×n array, and first ohmic metal layer. Surface of substrate includes light-emitting regions in array of m rows and n columns and non-light-emitting region surrounding each light-emitting region, m×n≥2. Each emitter includes first DBR on surface of substrate, active layer on side of first DBR away from substrate, and second DBR on side of active layer away from substrate, at least part of first DBR disposed in respective light-emitting region, active layer and second DBR disposed in respective light-emitting region. First ohmic metal layer disposed on surface of first DBR away from substrate and disposed in non-light-emitting region, projection of first ohmic metal layer on substrate doesn't overlap projections of first and second connecting lines on substrate, first and second connecting lines respec- (Continued)

tively connects centers of emitters in same row, connects centers of emitters in same column.

10 Claims, 14 Drawing Sheets

(56) References Cited

U.S. PATENT DOCUMENTS

| | | | | |
|---|---|---|---|---|
| 2004/0174118 | A1* | 9/2004 | Yukimoto | H10H 29/14 313/512 |
| 2007/0036189 | A1 | 2/2007 | Hori et al. | |
| 2009/0129417 | A1* | 5/2009 | Maeda | H01S 5/18355 438/46 |
| 2010/0172390 | A1 | 7/2010 | Matsubara et al. | |
| 2011/0079798 | A1* | 4/2011 | Ogihara | H10H 20/813 257/E33.044 |
| 2018/0269655 | A1* | 9/2018 | Koyama | H01S 5/18377 |
| 2018/0356459 | A1* | 12/2018 | Kubota | H01S 5/0021 |
| 2018/0366907 | A1 | 12/2018 | Joseph | |
| 2019/0067908 | A1 | 2/2019 | Onishi | |
| 2019/0148914 | A1* | 5/2019 | Fujii | H01S 5/18308 372/50.124 |
| 2019/0273360 | A1 | 9/2019 | Kawashima | |
| 2019/0355786 | A1* | 11/2019 | Iguchi | H10H 29/142 |
| 2019/0363520 | A1* | 11/2019 | Laflaquiere | H01S 5/0261 |
| 2020/0083669 | A1* | 3/2020 | Na | G01P 13/00 |
| 2020/0144792 | A1 | 5/2020 | Dummer | |
| 2020/0313391 | A1* | 10/2020 | Li | H01S 5/187 |
| 2020/0313401 | A1* | 10/2020 | Yuen | H01S 5/02345 |
| 2020/0321754 | A1 | 10/2020 | Hegblom et al. | |
| 2020/0350362 | A1* | 11/2020 | Iguchi | H10H 29/142 |
| 2020/0350742 | A1* | 11/2020 | Chung | H01S 5/04254 |
| 2020/0412089 | A1* | 12/2020 | Mori | H01S 5/04257 |
| 2021/0083452 | A1* | 3/2021 | Hanaoka | H01S 5/0234 |
| 2021/0104867 | A1* | 4/2021 | Weigl | H01S 5/02345 |
| 2021/0167579 | A1 | 6/2021 | Izumiya et al. | |
| 2023/0128994 | A1* | 4/2023 | Kang | H01S 5/04257 372/50.124 |
| 2025/0070535 | A1* | 2/2025 | Yuen | H01S 5/423 |

FOREIGN PATENT DOCUMENTS

| | | | | | |
|---|---|---|---|---|---|
| CN | 106505410 | A | | 3/2017 | |
| CN | 108808444 | A | | 11/2018 | |
| CN | 110323669 | A | | 10/2019 | |
| CN | 110858702 | A | | 3/2020 | |
| CN | 111224320 | A | | 6/2020 | |
| CN | 111799653 | A | | 10/2020 | |
| CN | 112335143 | A | | 2/2021 | |
| CN | 112970156 | A | | 6/2021 | |
| CN | 215267072 | U | | 12/2021 | |
| CN | 114552374 | A | * | 5/2022 | H01S 5/04256 |
| CN | 118891794 | A | * | 11/2024 | H01S 5/04256 |
| JP | 2007073585 | A | * | 3/2007 | |
| JP | 2019040953 | A | | 3/2019 | |
| JP | 7434849 | B2 | * | 2/2024 | H01S 5/18361 |
| KR | 100384598 | B1 | | 5/2003 | |
| KR | 102160549 | B1 | | 9/2020 | |
| WO | 2020002028 | A1 | | 1/2020 | |
| WO | WO-2022130825 | A1 | * | 6/2022 | H01S 5/423 |
| WO | WO-2023176308 | A1 | * | 9/2023 | H01S 5/02345 |

OTHER PUBLICATIONS

International Search Report issued in International Application No. PCT/CN2021/111723 dated Mar. 30, 2022, English Translation.

First Office Action received from the State Intellectual Property Office of People's Republic of China in connection with International Application No. 202110777105.8, dated Mar. 24, 2022.

Taiwanese Office Action issued by the Intellectual Property Bureau of the Ministry of Economic Affairs in connection with International Application No. 111117315, dated Jun. 21, 2023.

Japanese Office Action issued by the Japanese Patent Office in connection with International Application No. 2022-560446, dated Nov. 7, 2023.

Korean Office Action issued by the Korean Patent Office in connection with International Application No. 10-2022-7038259, dated Jan. 8, 2024.

* cited by examiner

VERTICAL-CAVITY SURFACE-EMITTING LASER

CROSS-REFERENCE TO RELATED APPLICATION(S)

This is a national stage application filed under 37 U.S.C. 371 based on International Patent Application No. PCT/CN2021/111723, filed Aug. 10, 2021, which claims priority to Chinese Patent Application No. 202110777105.8 filed Jul. 9, 2021, the disclosures of which are incorporated herein by reference in their entireties.

TECHNICAL FIELD

The present application relates to the field of semiconductor technologies, for example, a vertical cavity surface emitting laser.

BACKGROUND

A vertical cavity surface emitting laser (VCSEL) is developed on the basis of the semiconductor material of gallium arsenide. Due to its advantages of small volume, low threshold current, high modulation frequency and easy fiber coupling, the VCSEL may be not only applied in optical communication, optical interconnection, optical information processing and other fields, but also applied in the mobile phone, the unmanned vehicle light detection and ranging (Lidar) and other electronic consumption fields as a light source of structured light technology in 3-Dimension (3D) recognition.

To achieve a VCSEL with a small dimension, it is necessary to keep reducing the spacing between the adjacent emitters in the VCSEL. However, the spacing between the adjacent emitters may not be further reduced due to the structural arrangement of the VCSEL.

SUMMARY

The present application provides a VCSEL to reduce the spacing between the adjacent emitters in the VCSEL.

The present application provides a VCSEL. The VCSEL includes a substrate, emitters arranged in an m×n array, and a first ohmic metal layer. A surface of the substrate includes light-emitting regions arranged in an array of m rows and n columns and a non-light-emitting region surrounding each of the light-emitting regions, where m is an integer greater than or equal to 1, n is an integer greater than or equal to 1, and a product of m and n is greater than or equal to 2.

Each of the emitters includes a first distributed Bragg reflection (DBR) disposed on the surface of the substrate, an active layer disposed on a side of the first DBR facing away from the substrate, and a second DBR disposed on a side of the active layer facing away from the substrate, where at least part of the first DBR is disposed in a respective light-emitting region, and the active layer and the second DBR are disposed in the respective light-emitting region.

The first ohmic metal layer is disposed on a surface of the first DBR facing away from the substrate and disposed in the non-light-emitting region, where a projection of the first ohmic metal layer on the substrate does not overlap with a projection of a first connecting line on the substrate, and the projection of the first ohmic metal layer on the substrate does not overlap with a projection of a second connecting line on the substrate, where the first connecting line is a straight line connecting centers of emitters in a same row, and the second connecting line is a straight line connecting centers of emitters in a same column.

DETAILED DESCRIPTION

The present application is described below in conjunction with drawings and embodiments.

Figure 1:
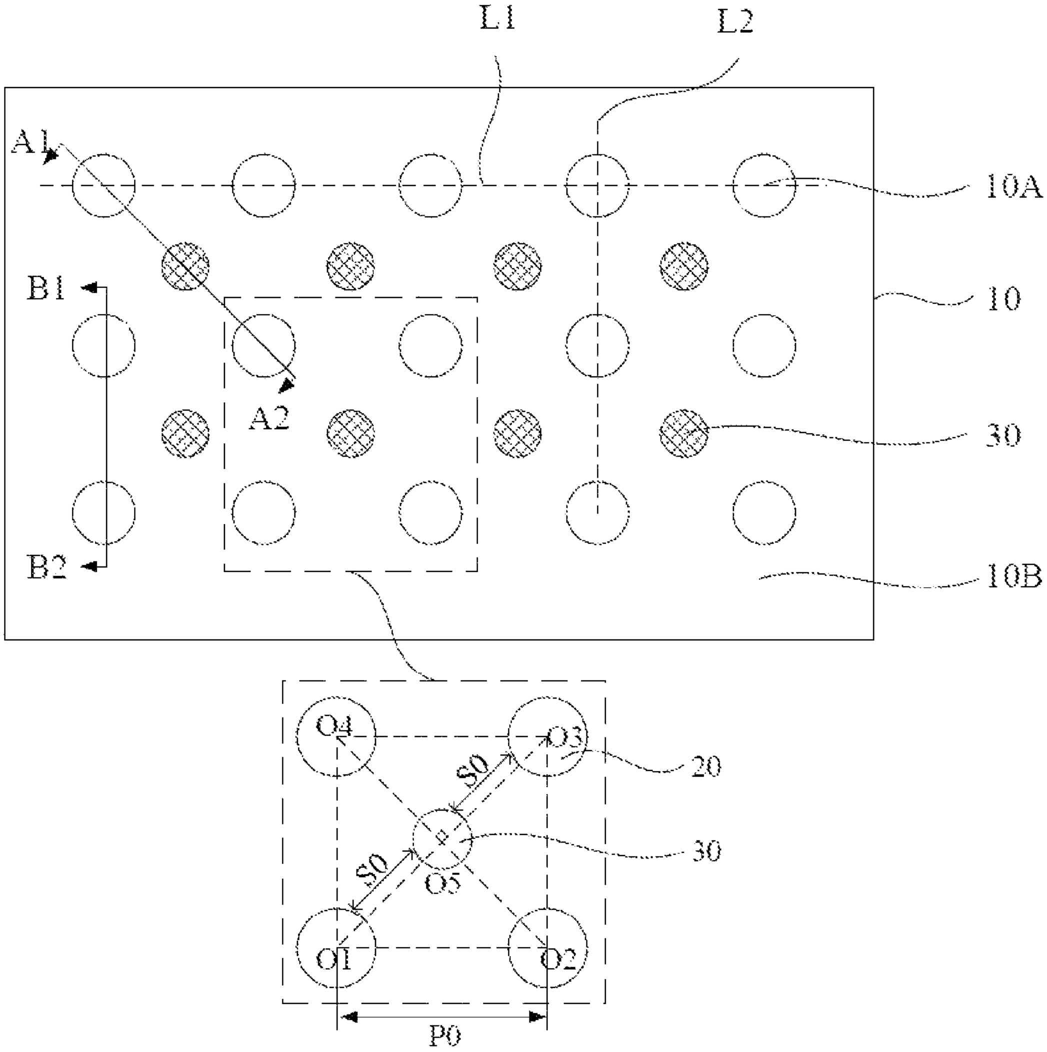
FIG. 1 is a top diagram of a VCSEL according to an embodiment of the present application.
Figure 2:
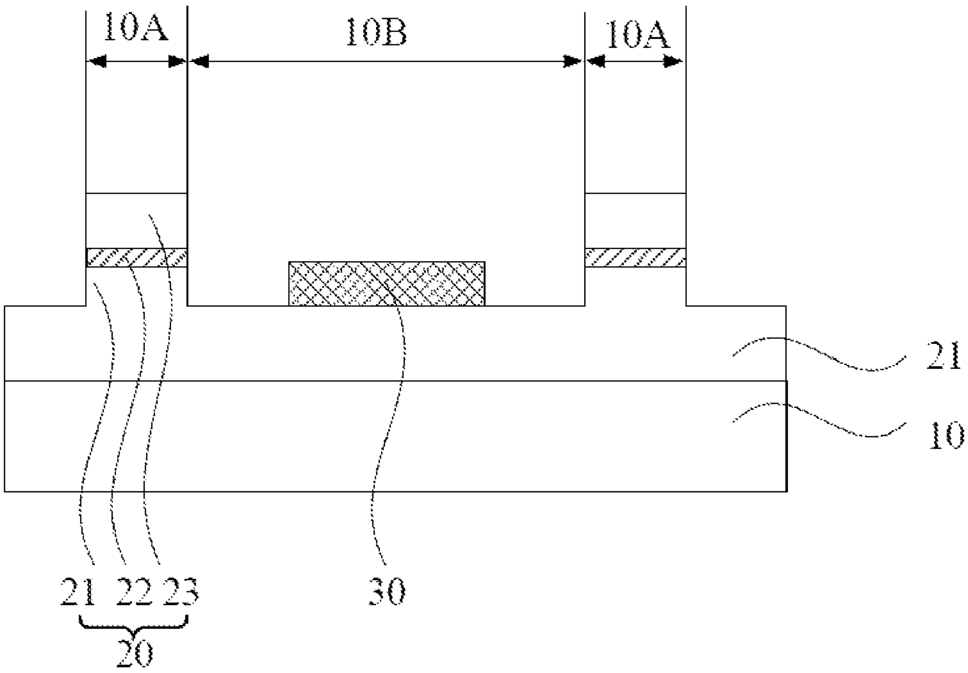
FIG. 2 is a sectional diagram of the VCSEL in FIG. 1 taken along the A1-A2 direction.
Figure 3:
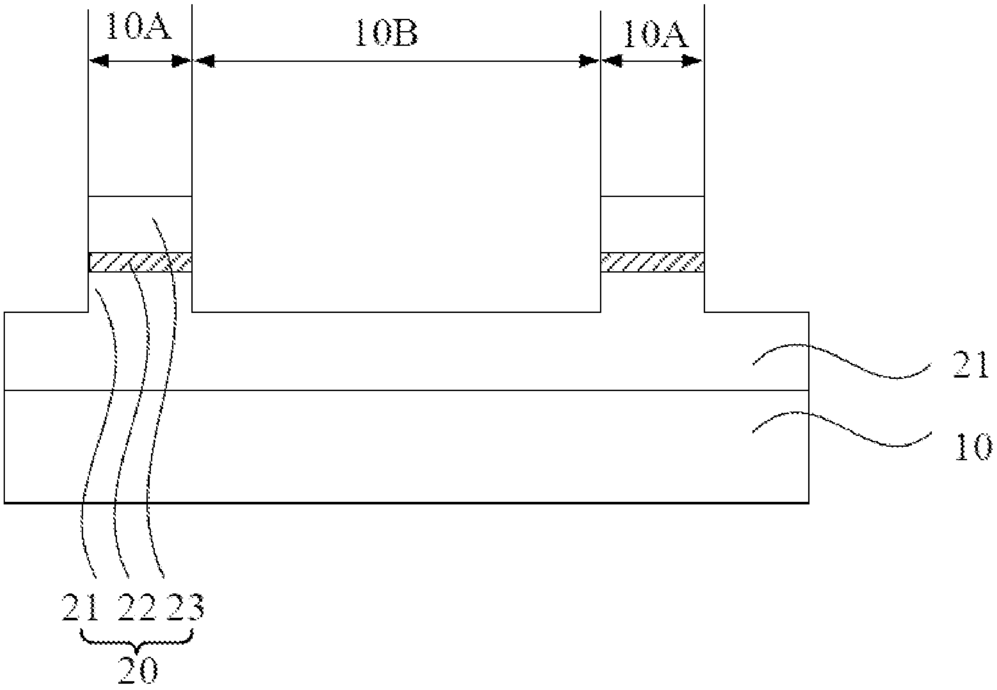
FIG. 3 is a sectional diagram of the VCSEL in FIG. 1 taken along the B1-B2 direction.

Embodiments of the present application provide a VCSEL. FIG. 1 is a top diagram of a VCSEL according to an embodiment of the present application. FIG. 2 is a sectional diagram of the VCSEL in FIG. 1 taken along the A1-A2 direction. FIG. 3 is a sectional diagram of the VCSEL in FIG. 1 taken along the B1-B2 direction. Referring to FIGS. 1 to 3, the VCSEL includes a substrate 10, emitters 20 arranged in an m×n array, and a first ohmic metal layer 30. A surface of the substrate 10 includes light-emitting regions 10A arranged in an array of m rows and n columns and a non-light-emitting region 10B surrounding the light-emitting regions 10A, where m is an integer greater than or equal to 1, n is an integer greater than or equal to 1, and a product of m and n is greater than or equal to 2. Each of the emitters 20 includes a first DBR 21 disposed on the surface of the substrate 10, an active layer 22 disposed on a side of the first DBR 21 facing away from the substrate 10, and a second DBR 23 disposed on a side of the active layer 22 facing away from the substrate 10, where at least part of the first DBR 21 is disposed in a respective light-emitting region 10A, and the active layer 22 and the second DBR 23 are disposed in the respective light-emitting region 10A. The first ohmic metal layer 30 is disposed on a surface of the first DBR 21 facing away from the substrate 10 and disposed in the non-light-emitting region 10B, where a projection of the first ohmic metal layer 30 on the substrate 10 does not overlap with a projection of a first connecting line L1 on the substrate 10, and the projection of the first ohmic metal layer 30 on the substrate 10 does not overlap with a projection of a second connecting line L2 on the substrate 10, where the first connecting line L1 is a straight line connecting centers of emitters 20 in a same row, and the second connecting line L2 is a straight line connecting centers of emitters 20 in a same column. The emitter 20 further includes a second ohmic contact layer (not shown in the figure) disposed on the second DBR 23.

Figure 4:
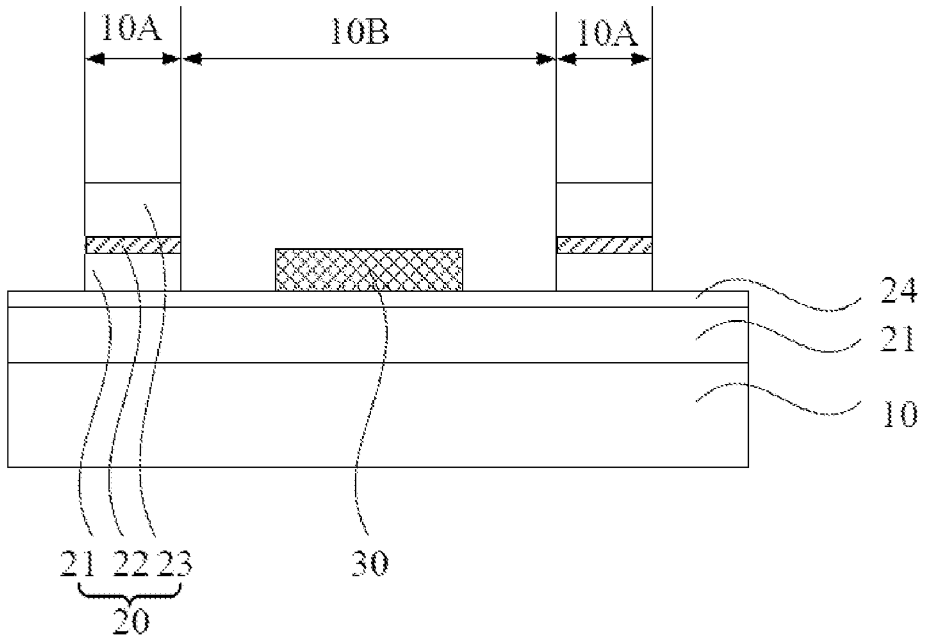
FIG. 4 is another sectional diagram of the VCSEL in FIG. 1 taken along the A1-A2 direction.
Figure 5:
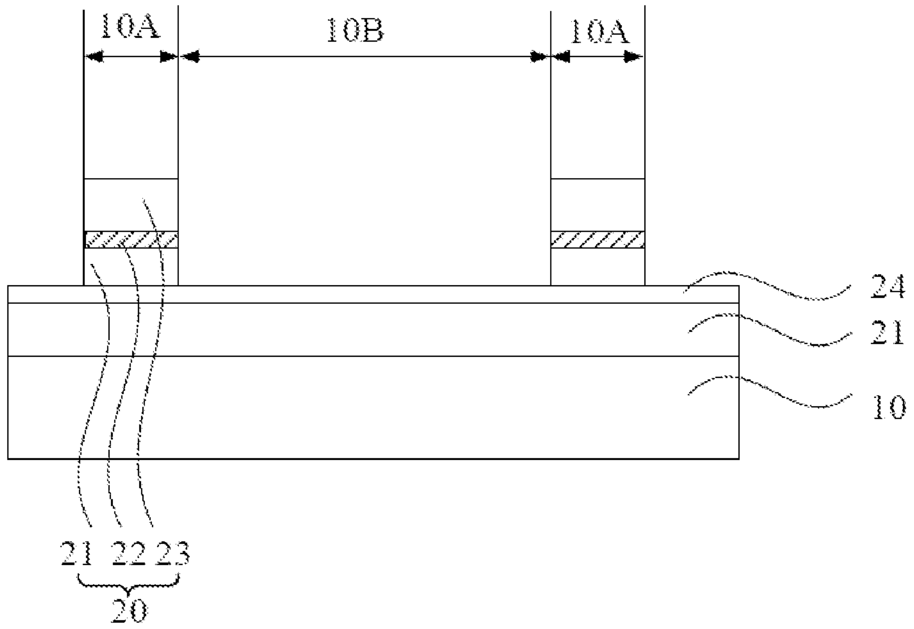
FIG. 5 is another sectional diagram of the VCSEL in FIG. 1 taken along the B1-B2 direction.
Figure 6:
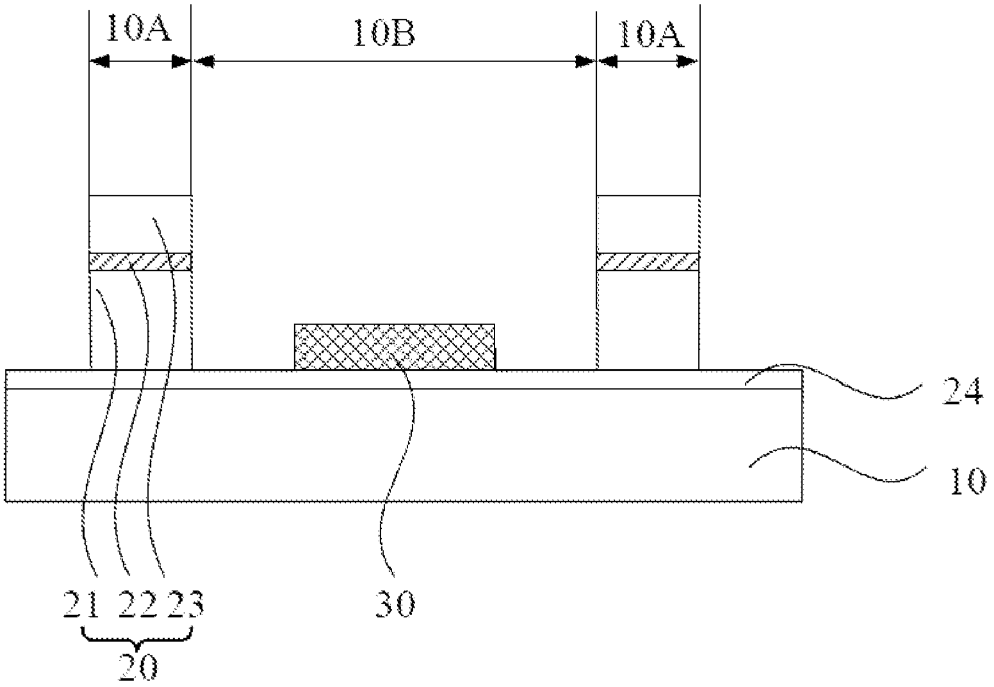
FIG. 6 is another sectional diagram of the VCSEL in FIG. 1 taken along the A1-A2 direction.
Figure 7:
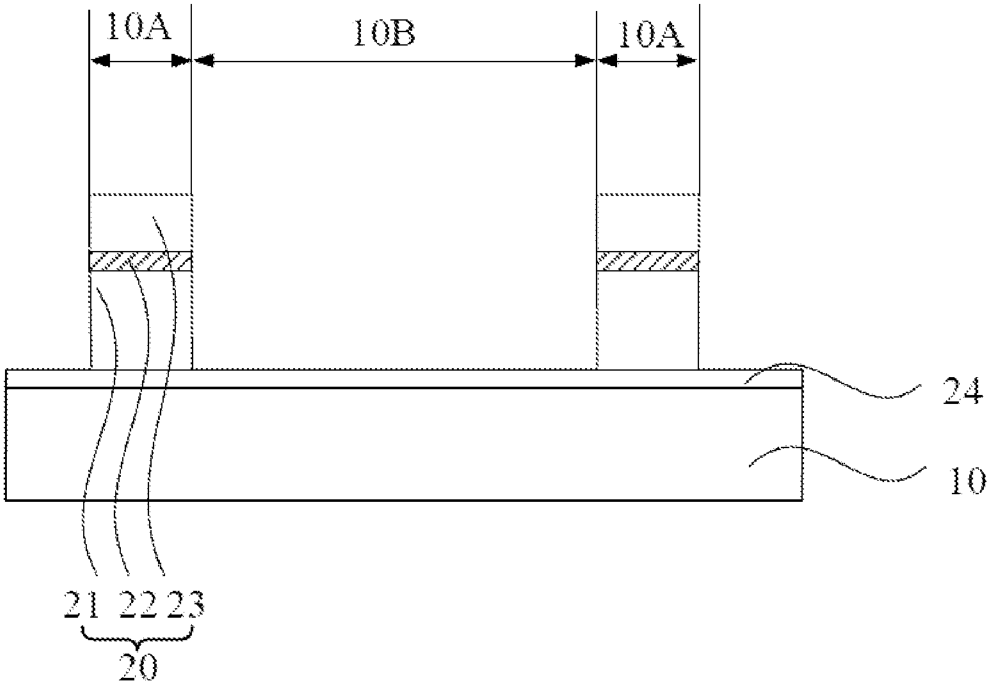
FIG. 7 is another sectional diagram of the VCSEL in FIG. 1 taken along the B1-B2 direction.

FIG. 4 is another sectional diagram of the VCSEL in FIG. 1 taken along the A1-A2 direction. FIG. 5 is another sectional diagram of the VCSEL in FIG. 1 taken along the B1-B2 direction. FIG. 6 is another sectional diagram of the VCSEL in FIG. 1 taken along the A1-A2 direction. FIG. 7 is another sectional diagram of the VCSEL in FIG. 1 taken along the B1-B2 direction.

Referring to FIGS. 4 to 7, the VCSEL further includes a first ohmic contact layer 24 disposed in the light-emitting regions 10A and the non-light-emitting region 10B. Referring to FIGS. 4 and 5, the first ohmic contact layer 24 is disposed in the first DBR 21; alternatively, referring to FIGS. 6 and 7, the first ohmic contact layer 24 is disposed between the first DBR 21 and the substrate 10. The first ohmic contact layer 24 is provided so that the first ohmic metal layer 30 and the first DBR 21 form a good ohmic contact. A position of the first ohmic contact layer in the embodiments of the present application may be set according to actual situations.

In an example, FIG. 1 shows the light-emitting regions 10A arranged in an array of three rows and five columns and correspondingly shows the emitters 20 arranged in a 3×5 array. The first connecting line L1 is a straight line connecting centers of the emitters 20 in any row, and the second connecting line L2 is a straight line connecting centers of the emitters 20 in any column. Only the first connecting line L1 connecting centers of the emitters 20 in the first row and the second connecting line L2 connecting centers of the emitters 20 in the fourth column are shown in FIG. 1.

In an example, to calculate a spacing between adjacent emitters 20 in the same row and a spacing between adjacent light-emitting unis 20 in the same column, in the embodiments of the present application, a first mathematical model is established below.

As shown in FIG. 1, centers of four adjacent emitters 20 are configured to form a square having a side length of P0. The centers of the four adjacent emitters 20 are represented as O1, O2, O3, and O4, respectively. A center O5 of the first ohmic metal layer 30 is disposed at a center of a diagonal of the square. A spacing between the first ohmic metal layer 30 and the emitter 20 is S0, a radius of the emitter 20 is r1, and the first ohmic metal layer 30 is circular and has a radius of r2. The spacing P0 between the centers of adjacent emitters 20 in the same row and the spacing P0 between the centers of adjacent emitters 20 in the same column satisfy the formula (1) described below.

$$P0 = \frac{2S0 + 2r2 + 2r1}{\sqrt{2}} \quad (1)$$

For the technical solution in which the first ohmic metal layer is disposed on the first connecting line connecting centers of the emitters in the same row and the second connecting line connecting centers of the emitters in the same column, a second mathematical model is established. The first ohmic metal layer is configured to be disposed at a center of the first connecting line connecting the centers of adjacent emitters in the same row and at a center of the second connecting line connecting the centers of adjacent emitters in the same column, the radius of the emitter is r1, the radius of the first ohmic metal layer is r2, the spacing between the first ohmic metal layer and the emitter is S0, and a spacing P1 between the centers of adjacent emitters in the same row and a spacing P1 between the centers of adjacent emitters in the same column satisfy the formula (2) described below.

$$P1 = 2S0 + 2r2 + 2r1 \quad (2)$$

By comparing the formula (1) with the formula (2), in the technical solution provided in the embodiments of the present application, the spacing between the centers of adjacent emitters in the same row and the spacing between the centers of adjacent emitters in the same column are reduced, thereby reducing the spacings between adjacent emitters in the same row and the spacings between adjacent emitters in the same column.

As shown in FIG. 1, the spacing P0 between the centers of adjacent emitters 20 in the same row and the spacing P0 between the centers of adjacent emitters 20 in the same column are obtained based on the first mathematical model constructed by four emitters 20. In the process of practical application, m is an integer greater than or equal to 1, n is an integer greater than or equal to 1, the product of m and n is greater than or equal to 2, and it only needs to ensure that a projection of the first ohmic metal layer 30 on the substrate 10 does not overlap with a projection of the first connecting line L1 on the substrate 10 and the projection of the first ohmic metal layer 30 on the substrate 10 does not overlap with a projection of the second connecting line L2 on the substrate 10. Compared with the technical solution in which the first ohmic metal layer is disposed on the first connecting line connecting the emitters in the same row and the second connecting line connected to the emitters in the same column, in the technical solution provided in the embodiments of the present application, the effect of reducing the spacing between adjacent emitters in the same row and the spacing between adjacent emitters in the same column may be achieved, thereby reducing a dimension between the emitters in the VCSEL.

Figure 8:
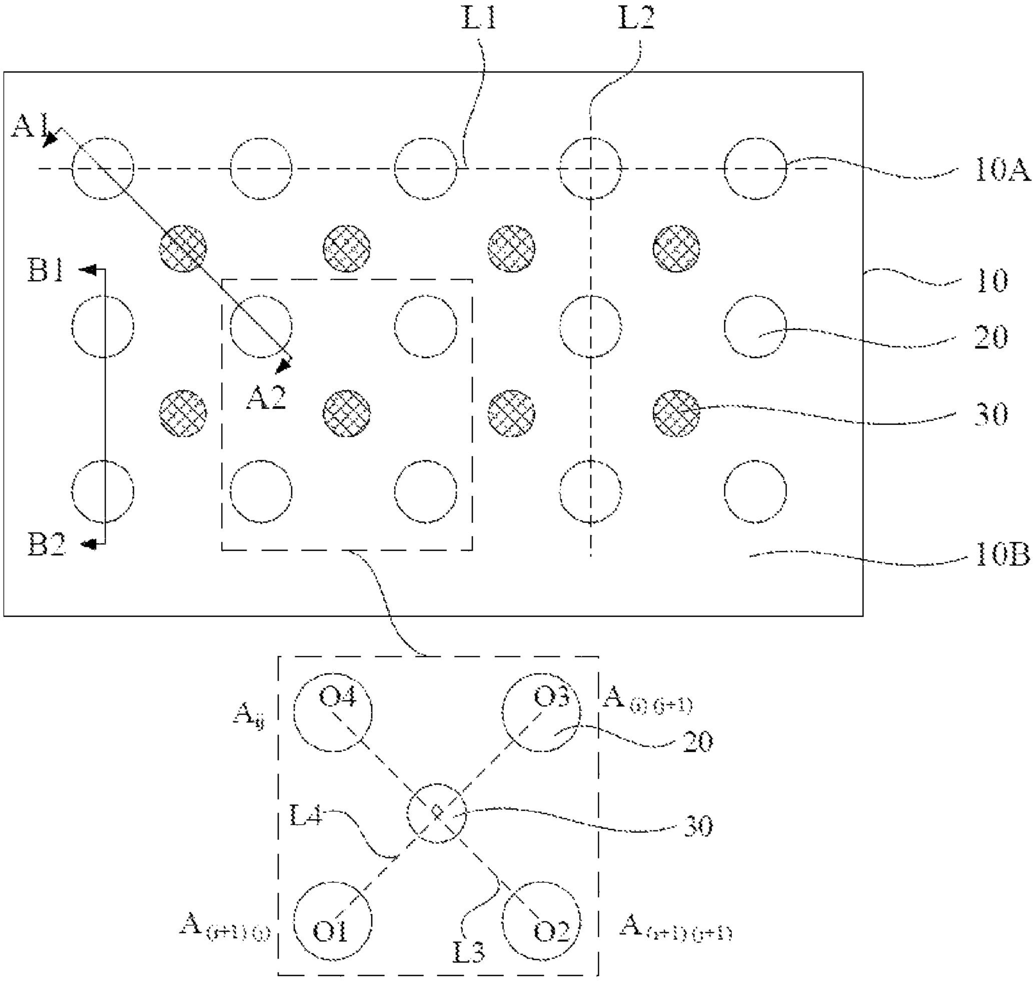
FIG. 8 is another top diagram of a VCSEL according to an embodiment of the present application.

FIG. 8 is a top diagram of another VCSEL according to an embodiment of the present application. Based on the preceding technical solution, in the VCSEL, referring to FIG. 8, m is greater than or equal to 2, n is greater than or equal to 2, and the first ohmic metal layer 30 is disposed in part of the non-light-emitting region 10B among an $A_{ij}$-th emitter 20, an $A_{(i+1)(j)}$-th emitter 20, an $A_{(i)(j+1)}$-th emitter 20, and an $A_{(i+1)(j+1)}$-th emitter 20, where i is greater than or equal to 1 and less than or equal to (m−1) and j is greater than or equal to 1 and less than or equal to (n−1).

For the VCSEL including the emitters 20 arranged in the m×n array, m is greater than or equal to 2, n is greater than or equal to 2, and the first ohmic metal layer 30 is disposed in the part of the non-light-emitting region 10B among four adjacent emitters 20 so that it may be ensured that the projection of the first ohmic metal layer 30 on the substrate 10 does not overlap with the projection of the first connecting line L1 on the substrate 10 and the projection of the first ohmic metal layer 30 on the substrate 10 does not overlap with the projection of the second connecting line L2 on the substrate 10. Compared with the technical solution in which the first ohmic metal layer is disposed on the connecting line connecting the centers of emitters in the same row and the connecting line connecting the centers of the emitters in the same column, in the technical solution provided in this embodiments of the present application, the effect of reducing the spacing between adjacent emitters in the same row and the spacing between adjacent emitters in the same column may be achieved, thereby reducing the dimension of the emitters in the VCSEL.

A shape of the first ohmic metal layer 30 is described below. Based on the preceding technical solution, FIG. 8 is used as an example for description. A shape of the projection of the first ohmic metal layer 30 on the substrate 10 is centrosymmetric, and a center of the shape of the projection of the first ohmic metal layer 30 on the substrate 10 coincides with an intersection point of a third connecting line L3 and a fourth connecting line L4. The third connecting line L3 is a connecting line connecting a center O4 of the $A_{ij}$-th emitter 20 and a center O2 of the $A_{(i+1)(j+1)}$-th emitter 20, and the fourth connecting line L4 is a connecting line between a center O1 of the $A_{(i+1)(j)}$-th emitter 20 and a center O3 of the $A_{(i)(j+1)}$-th emitter 20.

The shape of the projection of the first ohmic metal layer 30 on the substrate 10 is centrosymmetric, and the center of the shape of the projection of the first ohmic metal layer 30 on the substrate 10 coincides with the intersection point of the third connecting line L3 and the fourth connecting line L4 so that it may be ensured that spacings between the first ohmic metal layer 30 and the emitters 20 at two sides are equal in the direction where the third connecting line L3 is located and in the direction where the fourth connecting line L4 is located, thereby simplifying the layout difficulty of the first ohmic metal layer 30 and reducing the preparation difficulty of the VCSEL.

Based on the preceding technical solution, the shape of the projection of the first ohmic metal layer 30 on the substrate 10 includes a circle or a rhombus.

The shape of the projection of the first ohmic metal layer 30 on the substrate 10 includes a circle or a rhombus, thereby simplifying the layout difficulty of the first ohmic metal layer 30 and reducing the preparation difficulty of the VCSEL.

Figure 9:
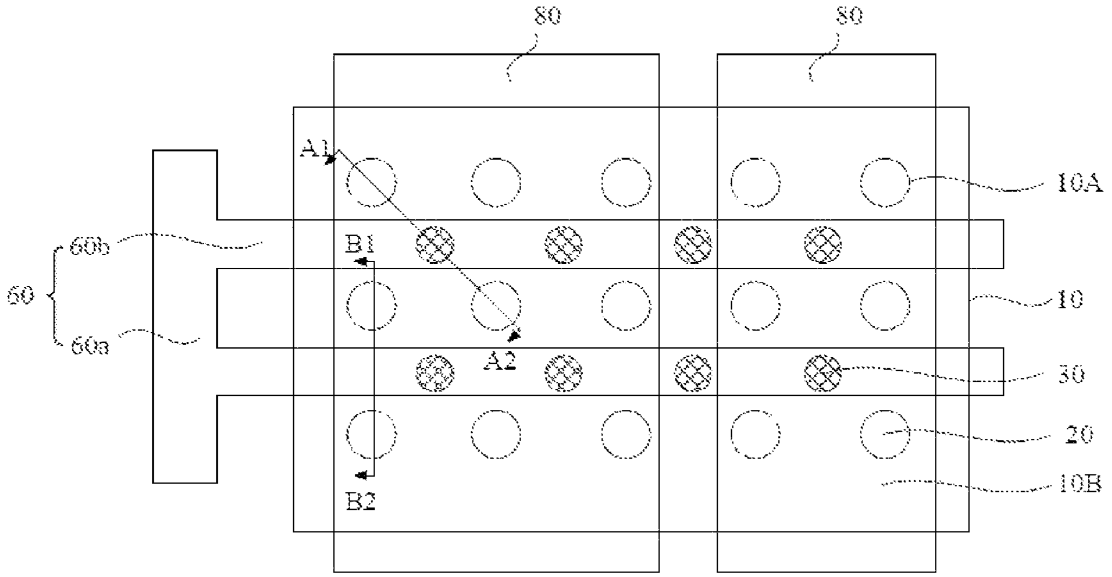
FIG. 9 is another top diagram of a VCSEL according to an embodiment of the present application.
Figure 10:
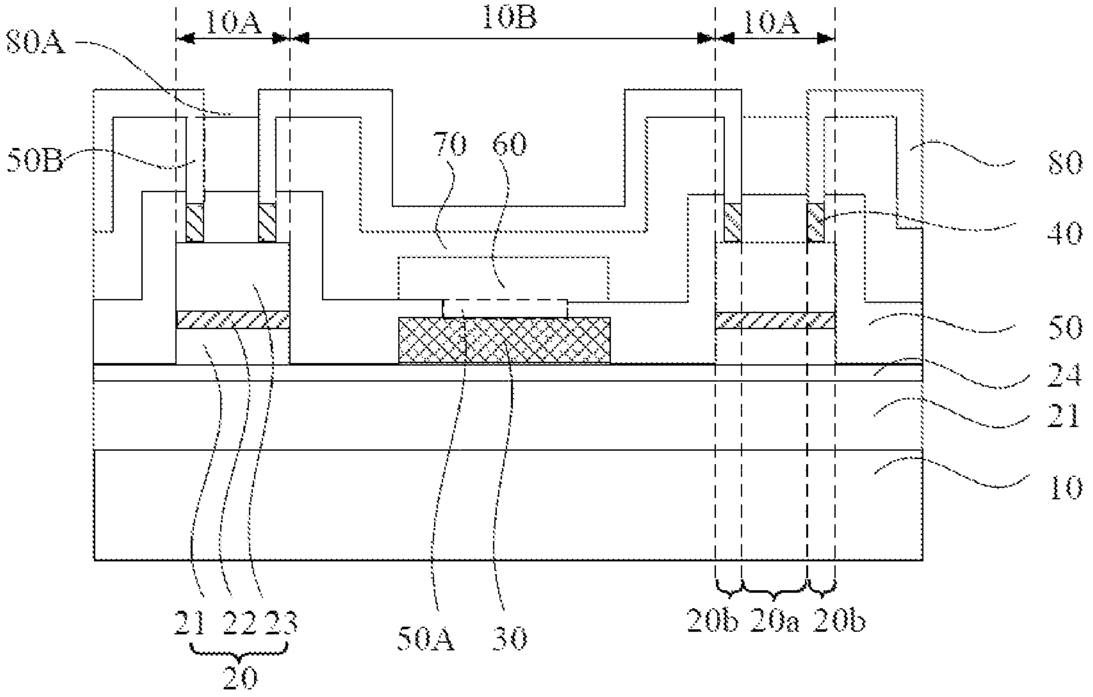
FIG. 10 is a sectional diagram of the VCSEL in FIG. 9 taken along the A1-A2 direction.
Figure 11:
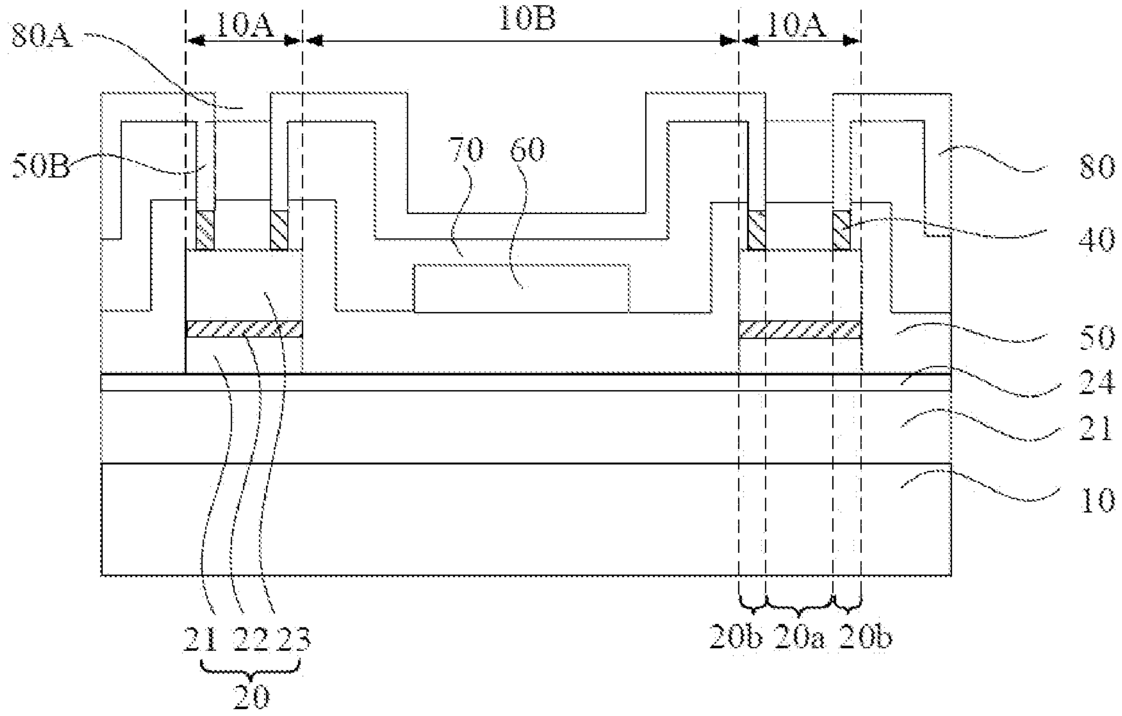
FIG. 11 is a sectional diagram of the VCSEL in FIG. 9 taken along the B1-B2 direction.

FIG. 9 is a top diagram of another VCSEL according to an embodiment of the present application. FIG. 10 is a sectional diagram of the VCSEL in FIG. 9 taken along the A1-A2 direction. FIG. 11 is a sectional diagram of the VCSEL in FIG. 9 taken along the B1-B2 direction. Referring to FIGS. 9 to 11, the emitter 20 further includes an emission window 20*a* and an edge region 20*b* surrounding the emission window 20*a*, where the emission window 20*a* and the edge region 20*b* are both disposed on a surface of a side of the second DBR 23 facing away from the substrate 10. The VCSEL further includes a second ohmic metal layer 40, a first passivation layer 50, a first pad 60, a second passivation layer 70, and a second pad 80. The second ohmic metal layer 40 is disposed on the surface of the side of the second DBR 23 facing away from the substrate 10 and disposed in the edge region 20*b*. The first passivation layer 50 is disposed on a side of the first ohmic metal layer 30 facing away from the substrate 10 and disposed in the light-emitting regions 10A and the non-light-emitting region 10B, and the first passivation layer 50 is provided with a first via 50A, where at least part of the first ohmic metal layer 30 is exposed from the first via 50A. The first pad 60 is disposed on a side of the first passivation layer 50 facing away from the substrate 10, a projection of the first pad 60 on the substrate 10 does not overlap with a projection of the emission window 20*a* of a respective emitter 20 on the substrate 10, and the first pad 60 is connected to the first ohmic metal layer 30 through the first via 50A. The second passivation layer 70 is disposed on a surface of the first pad 60 facing away from the substrate 10 and covers the light-emitting regions 10A and the non-light-emitting region 10B. The second passivation layer 70 and the first passivation layer 50 are provided with a second via 50B, where at least part of the second ohmic metal layer 40 is exposed from the second via 50B. The second pad 80 is disposed on a surface of a side of the second passivation layer 70 facing away from the substrate 10, a projection of the second pad 80 on the substrate 10 does not overlap with the projection of the emission window 20*a* of the respective emitter 20 on the substrate 10, and the second pad 80 is connected to the second ohmic metal layer 40 through the second via 50B.

The first passivation layer 50 is configured to protect the first ohmic metal layer 30 and the second ohmic metal layer 40, the first pad 60 is connected to the first ohmic metal layer 30 through the first via 50A, and the second pad 80 is connected to the second ohmic metal layer 40 through the second via 50B so as to enable the first pad 60 to flow an external current signal into the first DBR 21 of the emitter 20 through the first ohmic metal layer 30 or enable the second pad 80 to flow an external current signal into the second DBR 23 through the second ohmic metal layer 40.

Refractive indices of the first DBR 21 and the second DBR 23 are different. In the case where a thickness of the first DBR 21 and a thickness of the second DBR 23 are an integer multiple of a quarter of a preset wavelength, the first DBR 21 and the second DBR 23 may transmit light of the preset wavelength. The first DBR 21 and the second DBR 23 are semiconductor materials that are grown periodically, that is, the first DBR 21 and the second DBR 23 are periodic multi-layer structure materials that are formed by alternately growing different film layers. The active layer 22 is a quantum material of well luminescent and emits light under the action of a current signal, and the emitted light is reflected between the first DBR 21 and the second DBR 23 and then exits from the second DBR 23. The embodiments of the present application include the technical solution in which the light emitted by the VCSEL exits from the second DBR 23 shown in the figures and may further include the technical solution in which the light emitted by the VCSEL exits from the first DBR 21.

In the embodiments of the present application, the projection of the first ohmic metal layer 30 on the substrate 10 does not overlap with the projection of the first connecting line L1 on the substrate 10, the projection of the first ohmic metal layer 30 on the substrate 10 does not overlap with the projection of the second connecting line L2 on the substrate 10, the first pad 60 applies an external current signal to the first DBR 21 of the emitter 20 through the first ohmic metal layer 30, the second pad 80 applies an external current signal to the second DBR 23 through the second ohmic metal layer 40, the active layer 22 emits light under the action of the current signal, and the emitted light is reflected between the first DBR 21 and the second DBR 23 and then exits. Compared with the VCSEL in which the first ohmic metal layer is disposed on a straight line connecting the centers of the emitters in the same row and a straight line connecting the centers of the emitters in the same column, the VCSEL provided in the embodiments of the present application may achieve the effect of reducing the spacing between adjacent emitters in the same row and the spacing between adjacent emitters in the same column, thereby reducing the dimension of the emitters in the VCSEL. In addition, the projection of the first pad 60 on the substrate 10 does not overlap with the projection of the emission window 20*a* of the emitter 20 on the substrate 10, and the projection of the second pad 80 on the substrate 10 does not overlap with the projection of the emission window 20*a* of the emitter 20 on the substrate 10, thereby preventing the first pad and the second pad from blocking the light emitted from the emission window and improving the light output efficiency of the VCSEL.

A position of the projection of the first pad 60 on the substrate 10 is described below.

Figure 12:
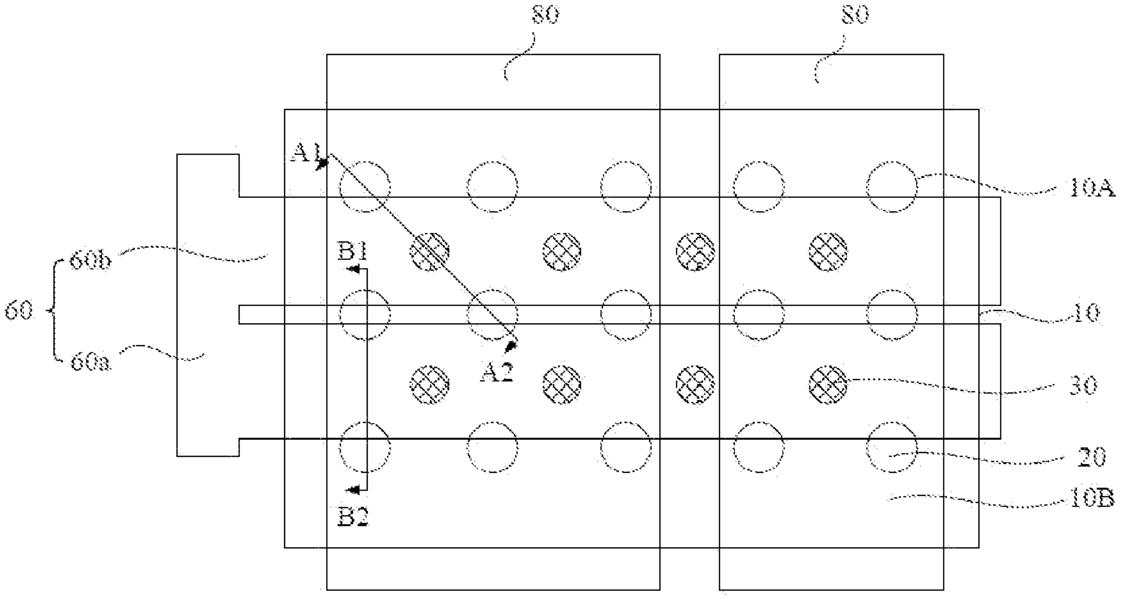
FIG. 12 is another top diagram of a VCSEL according to an embodiment of the present application.
Figure 13:
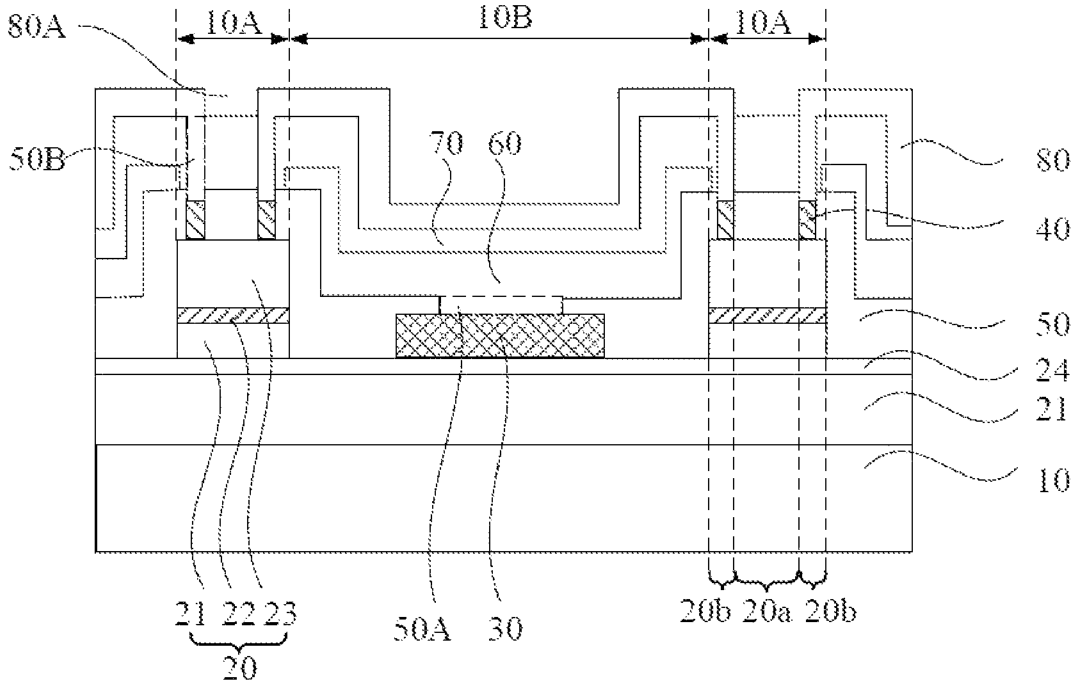
FIG. 13 is a sectional diagram of the VCSEL in FIG. 12 taken along the A1-A2 direction.
Figure 14:
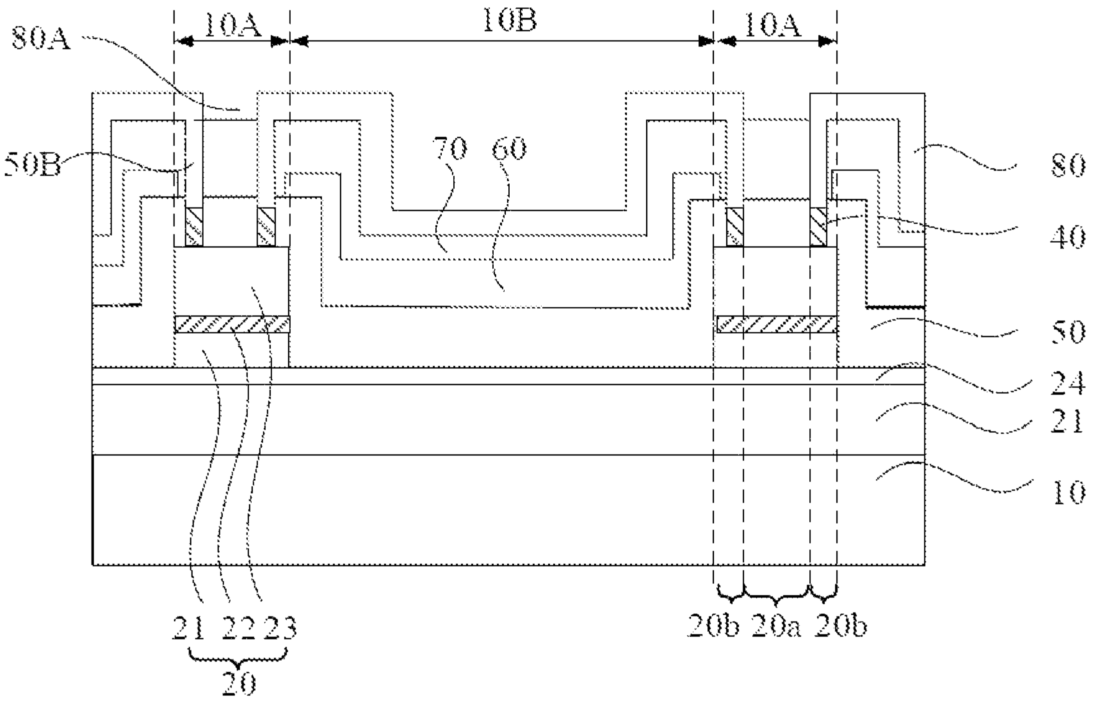
FIG. 14 is a sectional diagram of the VCSEL in FIG. 12 taken along the B1-B2 direction.

FIG. 12 is a top diagram of another VCSEL according to an embodiment of the present application. FIG. 13 is a sectional diagram of the VCSEL in FIG. 12 taken along the A1-A2 direction. FIG. 14 is a sectional diagram of the VCSEL in FIG. 12 taken along the B1-B2 direction. Based on the preceding technical solution, referring to FIGS. 9 to 11, the first pad 60 is disposed in the non-light-emitting region 10B; alternatively, referring to FIGS. 12 to 14, the first pad 60 is disposed in the non-light-emitting region 10B and the edge region 20*b* of the emitter 20.

The first pad 60, except for a part connected to the first ohmic metal layer 30, is insulated from the first DBR 21 through the first passivation layer 50. Therefore, the projection of the first pad 60 on the substrate 10 does not overlap with the projection of the emission window 20*a* of the emitter 20 on the substrate 10, so that the first pad 60 transmits a current signal to the first DBR 21 without affecting the light of the emitter 20 to exit from the emission window 20*a*. Therefore, in the technical solution provided in the embodiments of the present application, the first pad 60 is disposed in the non-light-emitting region 10B shown in FIGS. 9 to 11; alternatively, the first pad 60 is disposed in the non-light-emitting region 10B and the edge region 20*b* of the emitter 20 shown in FIGS. 12 to 14, so that the layout flexibility of the first pad may be improved.

Based on the preceding technical solution, referring to FIGS. 10 and 11 and FIGS. 13 and 14, the second pad 80 is provided with m×n light emission windows 80A, and a projection of the light emission window 80A on the substrate 10 overlaps with the projection of a respective emission window 20*a* on the substrate 10.

The number of light emission windows 80A provided on the second pad 80 is the same as the number of the emitters 20, and the projection of the light emission window 80A on the substrate 10 overlaps with the projection of the emission window 20*a* on the substrate 10, thereby preventing the second pad from blocking the light emitted from the emission window and improving the light output efficiency of the VCSEL. The light emission windows are defined by performing a photolithography process on a metal film layer where the second pad is located.

Based on the preceding technical solution, referring to FIGS. 9 and 12, the first pad 60 includes a main connecting-portion 60*a* and at least one first-direction strip-shaped sub-connecting-portion 60*b* connected to the main connecting-portion 60*a*, where the main connecting-portion 60*a* is disposed on a side of the emitters 20 arranged in the m×n array, and the first-direction strip-shaped sub-connecting-portion 60*b* is disposed between two adjacent rows of the emitters 20.

The first pad 60 includes the main connecting-portion 60*a* and at least one first-direction strip-shaped sub-connecting-portion 60*b* connected to the main connecting-portion 60*a*, where the first-direction strip-shaped sub-connecting-portion 60*b* is disposed between two adjacent rows of the emitters 20, the main connecting-portion 60*a* is connected to an external driver circuit, the main connecting-portion 60*a* applies an external drive signal to the first DBR 21 through the first-direction strip-shaped sub-connecting-portion 60*b*, and the first-direction strip-shaped sub-connecting-portion 60*b* is disposed in the non-light-emitting region 10B shown in FIGS. 9 to 11, or the first-direction strip-shaped sub-connecting-portion 60*b* is disposed in the non-light-emitting region 10B and the edge region 20*b* of the emitter 20 shown in FIGS. 12 to 14, thereby preventing the first pad from blocking the light emitted from the emission window and improving the light output efficiency of the VCSEL.

Figure 15:
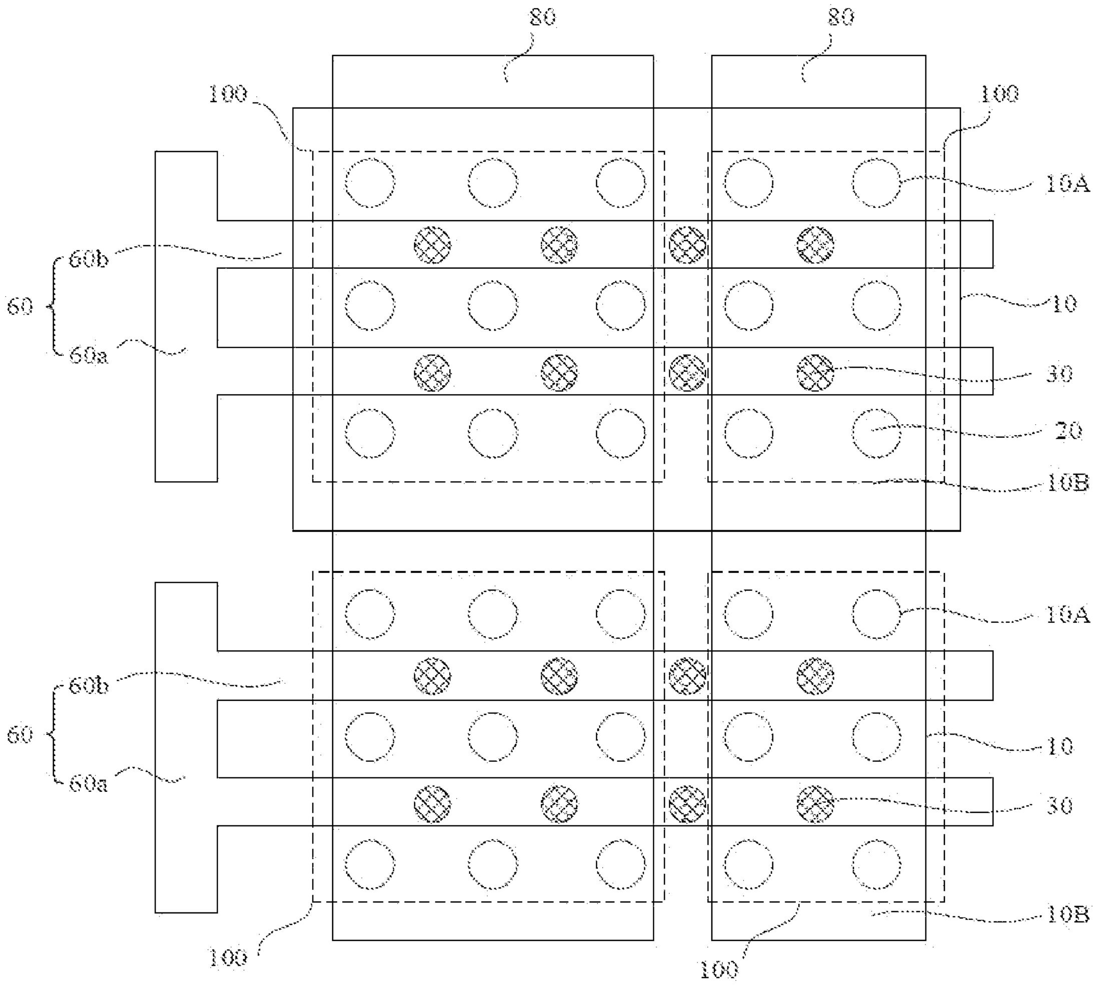
FIG. 15 is another top diagram of a VCSEL according to an embodiment of the present application.

FIG. 15 is a top diagram of another VCSEL according to an embodiment of the present application. Based on the preceding technical solution, referring to FIG. 15, the emitters arranged in the m×n array are divided into Q light emission control regions 100, a number of first pads 60 is K1, the number of second pads 80 is K2, Q is equal to a product of K1 and K2, and Q is greater than or equal to 1 and less than or equal to the product of m and n.

In an example, m has a value of 6, n has a value of 5, Q has a value of 4, the number of first pads 60 is two, and the number of second pads 80 is two. The number of the light emission control regions 100, the number of first pads 60, and the number of second pads 80 are not limited in the embodiments of the present application.

The emitters 20 arranged in the m×n array are divided into the Q light emission control regions 100 so that the emitters 20 belonging to the same light emission control region 100 are lighted and driven to emit light through current signals applied by the first pads 60 and the second pads 80.

Figure 16:
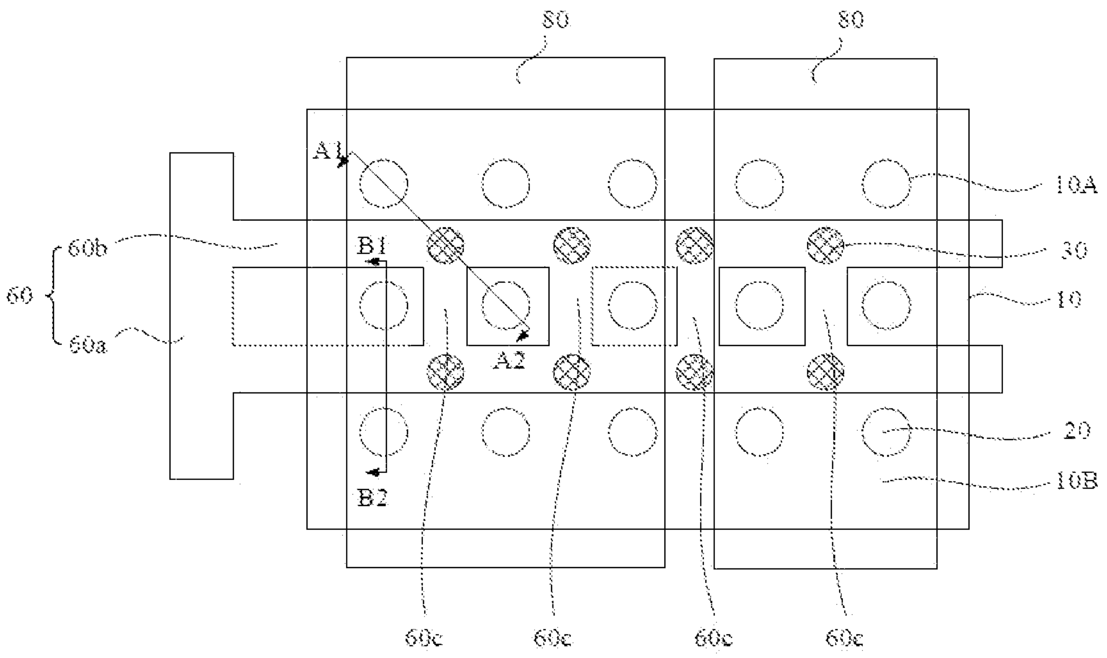
FIG. 16 is another top diagram of a VCSEL according to an embodiment of the present application.
Figure 17:
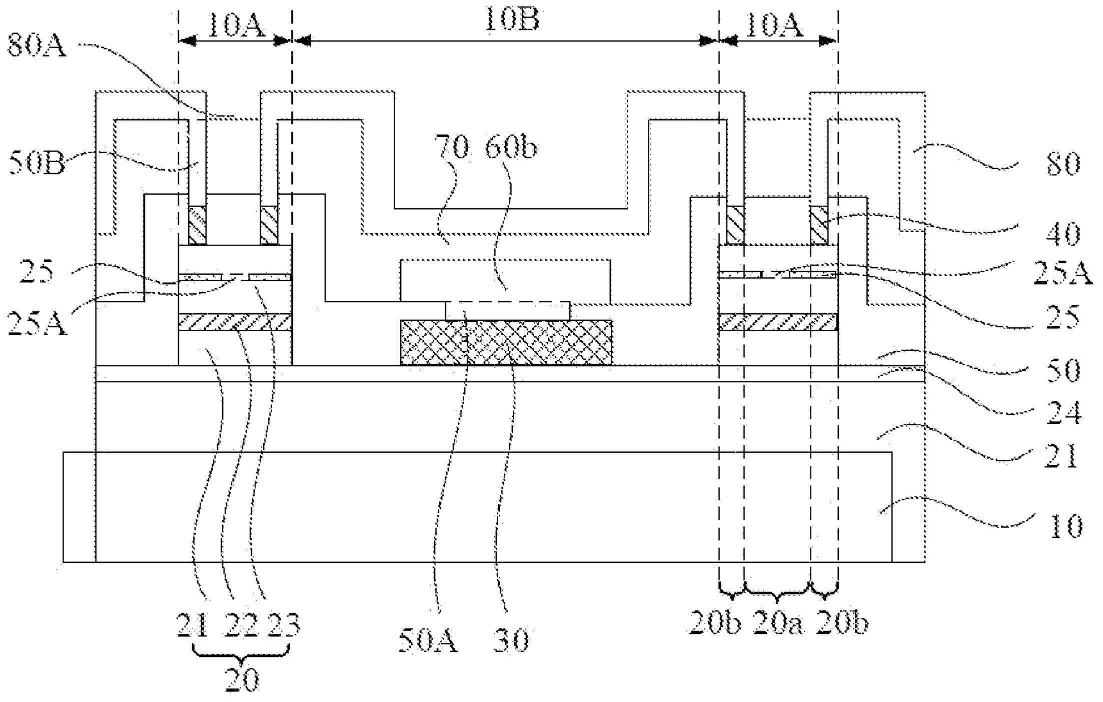
FIG. 17 is a sectional diagram of the VCSEL in FIG. 16 taken along the A1-A2 direction.
Figure 18:
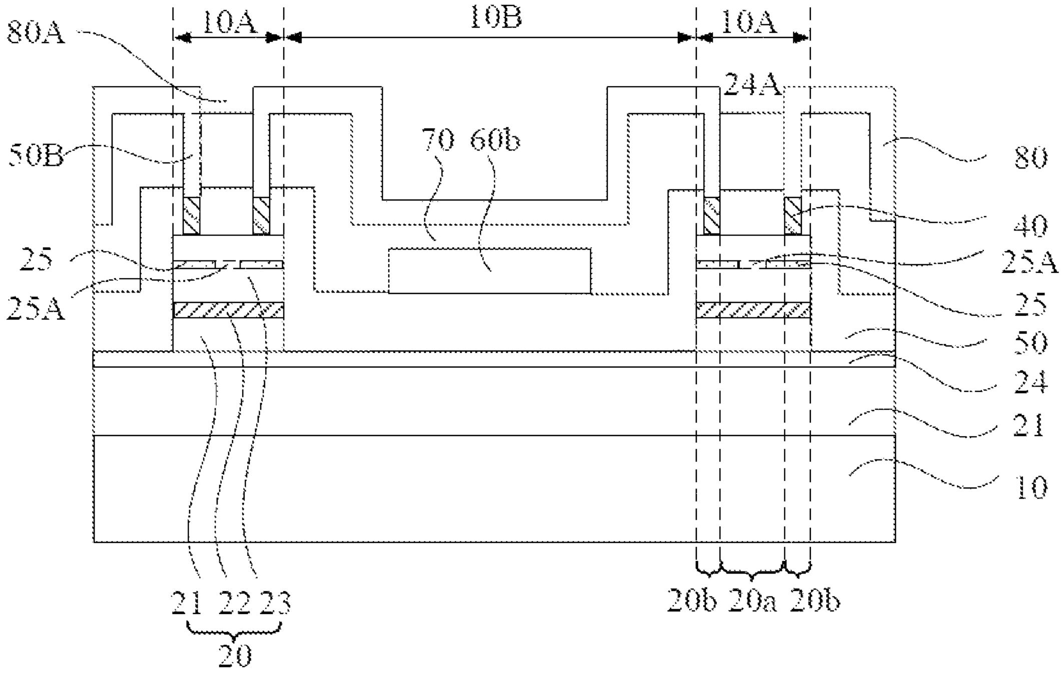
FIG. 18 is a sectional diagram of the VCSEL in FIG. 16 taken along the B1-B2 direction.

FIG. 16 is a top diagram of another VCSEL according to an embodiment of the present application. FIG. 17 is a sectional diagram of the VCSEL in FIG. 16 taken along the A1-A2 direction. FIG. 18 is a sectional diagram of the VCSEL in FIG. 16 taken along the B1-B2 direction. Based on the preceding technical solution, referring to FIGS. 16 to 18, the first pad 60 further includes at least one second-direction strip-shaped sub-connecting-portion 60*c*, where each of the at least one second-direction strip-shaped sub-connecting-portion 60*c* is connected to a respective one of the at least one first-direction strip-shaped sub-connecting-portion 60*b*. In the case where the first pad 60 includes multiple first-direction strip-shaped sub-connecting-portions 60*b* and multiple second-direction strip-shaped sub-connecting-portions 60*c*, two adjacent second-direction strip-shaped sub-connecting-portions 60*c* and two adjacent respective first-direction strip-shaped sub-connecting-portions 60*b* form a hashtag-shaped structure, each of the multiple second-direction strip-shaped sub-connecting-portion 60*c* is disposed between two adjacent columns of the emitters 20, and a projection of each of the multiple second-direction strip-shaped sub-connecting-portions 60*c* on the substrate 10 does not overlap with the projection of the emission window 20*a* of the emitter 20 on the substrate 10.

Two adjacent second-direction strip-shaped sub-connecting-portions 60*c* and two adjacent respective first-direction strip-shaped sub-connecting-portions 60*b* form the hashtag-shaped structure, thereby improving the uniformity of the current flowing through the first pad and further improving the uniformity of light emission of different emitters.

Based on the preceding technical solution, referring to FIGS. 16 and 17, the emitter 20 further includes a confining oxidation layer 25, where the confining oxidation layer 25 is disposed in the second DBR 23 and provided with an oxidation aperture 25A, where the oxidation aperture 25A is an optical aperture defined for the emitter 20.

The active layer 22 is a quantum material of well luminescent and emits light under the action of a current signal, and the emitted light is reflected between the first DBR 21 and the second DBR 23 and then exits from the second DBR 23. The embodiments of the present application include the technical solution in which the light emitted by the VCSEL exits from the oxidation aperture 25A shown in the figures.

The projection of the emission window 20*a* on the substrate 10 covers a projection of the oxidation aperture 25A on the substrate 10. In an example, the confining oxidation layer 25 is made from oxidized aluminum, and accordingly, the oxidation aperture 25A is gallium aluminum arsenide.

In FIGS. 15 to 18, the structure of the first pad 60 shown in FIG. 9 is used as an example for description, and the technical solution corresponding to FIGS. 15 to 18 is applicable to the case shown in FIG. 12 where the first pad 60 is disposed in the non-light-emitting region 10B and the edge region 20*b* of the emitter 20.

In the embodiments of the present application, the first DBR is P-type and the second DBR is N-type; or the first DBR is N-type and the second DBR is P-type.

In the VCSEL shown in FIGS. 8 to 18, the first ohmic contact layer 24 is disposed in the first DBR 21. The VCSEL shown in FIGS. 8 to 18 is also applicable to the technical solution in which the first ohmic contact layer 24 is disposed between the first DBR 21 and the substrate 10.

What is claimed is:

1. A vertical cavity surface emitting laser (VCSEL), comprising:

a substrate, wherein a surface of the substrate comprises light-emitting regions arranged in an array of m rows and n columns and a non-light-emitting region surrounding each of the light-emitting regions, wherein m is an integer greater than or equal to 1, n is an integer greater than or equal to 1, and a product of m and n is greater than or equal to 2;

emitters arranged in an mxn array, wherein each of the emitters comprises a first distributed Bragg reflection (DBR) disposed on the surface of the substrate, an active layer disposed on a side of the first DBR facing away from the substrate, and a second DBR disposed on a side of the active layer facing away from the substrate, wherein at least part of the first DBR is disposed in a respective light-emitting region of the light-emitting regions, and the active layer and the second DBR are disposed in the respective light-emitting region, wherein each of the emitters further comprises a first ohmic contact layer disposed in a respective light-emitting region and the non-light-emitting region, wherein the first ohmic contact layer is disposed in the first DBR, or the first ohmic contact layer is disposed between the substrate and the first DBR; and a first ohmic metal layer disposed on a surface of the first ohmic contact layer facing away from the substrate and disposed in the non-light-emitting region, wherein a projection of the first ohmic metal layer on the substrate does not overlap with a projection of a first connecting line on the substrate, and the projection of the first ohmic metal layer on the substrate does not overlap with a projection of a second connecting line on the substrate, wherein the first connecting line is a straight line where a connecting line connecting centers of emitters in a same row is located, and the second connecting line is a straight line where a connecting line connecting centers of emitters in a same column is located;

wherein each of the emitters further comprises an emission window and an edge region surrounding the emission window, wherein the emission window and the edge region are both disposed on a surface of a side of the second DBR facing away from the substrate;

wherein the VCSEL further comprises a second ohmic metal layer, a first passivation layer, a first pad, a second passivation layer, and a second pad;

wherein the second ohmic metal layer is disposed on the surface of the side of the second DBR facing away from the substrate and disposed in the edge region;

the first passivation layer is disposed on a side of the first ohmic metal layer facing away from the substrate and disposed in the light-emitting regions and the non-light-emitting region, and the first passivation layer is provided with a first via, wherein at least part of the first ohmic metal layer is exposed from the first via;

the first pad is disposed on a side of the first passivation layer facing away from the substrate, a projection of the first pad on the substrate does not overlap with a projection of the emission window of a respective emitter on the substrate, and the first pad is connected to the first ohmic metal layer through the first via;

the second passivation layer is disposed on a surface of the first pad facing away from the substrate and covers the light-emitting regions and the non-light-emitting region;

the second passivation layer and the first passivation layer are provided with a second via. wherein at least part of the second ohmic metal layer is exposed from the second via; and the second pad is disposed on a surface of a side of the second passivation layer facing away from the substrate, a projection of the second pad on the substrate does not overlap with the projection of the emission window of the respective emitter on the substrate, and the second pad is connected to the second ohmic metal layer through the second via.

2. The VCSEL of claim 1, wherein m is greater than or equal to 2, n is greater than or equal to 2, and the first ohmic metal layer is disposed in part of the non-light-emitting region among an $A_{ij}$-th emitter, an $A_{(i+1)(j)}$-th emitter, an $A_{(i)(j+1)}$-th emitter, and an $A_{(i+1)(j+1)}$-th emitter, wherein i is greater than or equal to 1 and less than or equal to (m−1), and j is greater than or equal to 1 and less than or equal to (n−1).

3. The VCSEL of claim 2, wherein a shape of the projection of the first ohmic metal layer on the substrate is centrosymmetric, and a center of the shape of the projection of the first ohmic metal layer on the substrate coincides with an intersection point of a third connecting line and a fourth connecting line;

wherein the third connecting line is a straight line where a connecting line connecting a center of the $A_{ij}$-th emitter and a center of the $A_{(i+1)(j+1)}$-th emitter is located, and the fourth connecting line is a straight line where a connecting line connecting a center of the $A_{(i+1)(j)}$-th emitter and a center of the $A_{(i)(j+1)}$-th emitter is located.

4. The VCSEL of claim 1, wherein the shape of the projection of the first ohmic metal layer on the substrate comprises a circle or a rhombus.

5. The VCSEL of claim 1, wherein the first pad is disposed in the non-light-emitting region; or the first pad is disposed in the non-light-emitting region and the edge region of the respective emitter.

6. The VCSEL of claim 1, wherein the second pad is provided with m×n light emission windows, and a projection of each of the light emission windows on the substrate overlaps with a projection of a respective emission window on the substrate.

7. The VCSEL of claim 1, wherein the first pad comprises a main connecting-portion and at least one first-direction strip-shaped sub-connecting-portion connected to the main connecting-portion, wherein the main connecting-portion is disposed on a side of the emitters arranged in the m×n array, and each of the at least one first-direction strip-shaped sub-connecting-portion is disposed between two adjacent rows of the emitters.

8. The VCSEL of claim 7, wherein the emitters arranged in the m×n array are divided into Q light emission control regions, a number of first pads is K1, a number of second pads is K2, Q is equal to a product of K1 and K2, and Q is greater than or equal to 1 and less than or equal to the product of m and n.

9. The VCSEL of claim 7, wherein each of the first pads further comprises at least one second-direction strip-shaped sub-connecting-portion, wherein each of the at least one second-direction strip-shaped sub-connecting-portion is connected to a respective one of the at least one first-direction strip-shaped sub-connecting-portion;

wherein in a case where each of the first pads comprises a plurality of first-direction strip-shaped sub-connecting-portions and a plurality of second-direction strip-shaped sub-connecting-portions, two adjacent ones of the plurality of second-direction strip-shaped sub-connecting-portions and two respective adjacent ones of the plurality of first-direction strip-shaped sub-connecting-portions form a hashtag-shaped structure, each of the plurality of second-direction strip-shaped sub-connecting-portions is disposed between two adjacent columns of the emitters, and a projection of each of the plurality of second-direction strip-shaped sub-connecting-portions on the substrate does not overlap with the projection of the emission window of a respective one of the emitters on the substrate.

10. The VCSEL of claim 1, wherein each of the emitters further comprises a confining oxidation layer, wherein the confining oxidation layer is disposed in the second DBR and provided with an oxidation aperture, and the oxidation aperture is an optical aperture defined for the respective one of the emitters.

* * * * *